(12) United States Patent
Kamezaki et al.

(10) Patent No.: US 12,235,685 B2
(45) Date of Patent: Feb. 25, 2025

(54) ELECTRONIC DEVICE

(71) Applicant: Panasonic Intellectual Property Management Co., Ltd., Osaka (JP)

(72) Inventors: Hiroki Kamezaki, Osaka (JP); Junichi Hasegawa, Osaka (JP); Shintarou Tanaka, Osaka (JP); Junpei Kohara, Osaka (JP); Kyota Yamamoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 68 days.

(21) Appl. No.: 18/231,825

(22) Filed: Aug. 9, 2023

(65) Prior Publication Data

US 2023/0384833 A1 Nov. 30, 2023

Related U.S. Application Data

(63) Continuation of application No. PCT/JP2022/002319, filed on Jan. 24, 2022.

(30) Foreign Application Priority Data

Feb. 26, 2021 (JP) .................................. 2021-029437

(51) Int. Cl.
*G06F 1/16* (2006.01)
*H01Q 1/42* (2006.01)

(52) U.S. Cl.
CPC .......... *G06F 1/1656* (2013.01); *G06F 1/1675* (2013.01); *H01Q 1/42* (2013.01)

(58) Field of Classification Search
CPC ..... G06F 1/1637; G06F 1/1669; G06F 1/1681
See application file for complete search history.

(56) References Cited

U.S. PATENT DOCUMENTS 5,590,346 A * 12/1996 West .................... H04W 88/06
  343/702
5,966,284 A * 10/1999 Youn .................... G06F 1/1669
  361/679.17

(Continued)

FOREIGN PATENT DOCUMENTS

JP   H05-094949 U   12/1993
JP   2004-194001 A   7/2004

(Continued)

OTHER PUBLICATIONS

International Search Report for corresponding Application No. PCT/JP2022/002319, mailed Mar. 8, 2023.

*Primary Examiner* — Adrian S Wilson
(74) *Attorney, Agent, or Firm* — Renner, Otto, Boisselle & Sklar, LLP

(57) ABSTRACT

An electronic device includes a housing, a covering member that covers the housing, and an attachment part that detachably attaches the covering member to the housing. The attachment part includes a one-side attachment part and at least one other-side attachment part. The one-side attachment part includes a first projection of the covering member extending from a first member toward a second member, a first accommodation part of the housing that accommodates the first projection, and a first movement restriction part that restricts movement of the first projection. The other-side attachment part includes a protrusion of the covering member extending from a second member toward a third surface of the housing, a second projection extending from the protrusion in a direction away from the first member, a second accommodation part of the housing that accommodates the second projection, and a second movement restriction part that restricts movement of the second projection.

5 Claims, 7 Drawing Sheets

(56) References Cited

U.S. PATENT DOCUMENTS

| | | | | |
|---|---|---|---|---|
| 6,531,985 | B1* | 3/2003 | Jones | G06F 1/1616 |
| | | | | 343/702 |
| 11,029,722 | B2* | 6/2021 | Lee | G06F 1/183 |
| 2002/0048975 | A1* | 4/2002 | Horikoshi | G06F 1/1688 |
| | | | | 439/78 |
| 2002/0085343 | A1* | 7/2002 | Wu | G06F 1/1658 |
| | | | | 361/679.55 |
| 2002/0118136 | A1* | 8/2002 | Gushiken | G06F 1/1656 |
| | | | | 343/702 |
| 2003/0007322 | A1* | 1/2003 | Amemiya | H01Q 1/084 |
| | | | | 361/679.27 |
| 2013/0286561 | A1* | 10/2013 | Hokugou | G06F 1/162 |
| | | | | 361/679.01 |

FOREIGN PATENT DOCUMENTS

| | | |
|---|---|---|
| JP | 2006-240084 A | 9/2006 |
| JP | 2015-033485 A | 2/2015 |

* cited by examiner

ELECTRONIC DEVICE

BACKGROUND

1. Technical Field

The present disclosure relates to an electronic device.

2. Description of the Related Art

Patent Literature (PTL) 1 discloses an antenna device provided with a cover that covers an antenna element.
PTL 1 is Unexamined Japanese Patent Publication No. 2004-194001.

SUMMARY

An object of the present disclosure is to provide an electronic device including a covering member that can be easily detached while the covering member is prevented from unintended falling off.

An electronic device according to one aspect of the present disclosure includes a housing that includes a first surface, a second surface widening along the first surface, and a third surface intersecting the first surface and the second surface, a covering member that covers the third surface, and an attachment part that detachably attaches the covering member to the third surface of the housing. The covering member includes a first member that extends along the first surface, a second member that extends along the second surface and faces the first member, and a third member that faces the third surface, the third member being connected to an end of the first member far from the housing in a first direction intersecting with the third surface and an end of the second member far from the housing in the first direction. The housing includes a support part that is disposed between the first surface and the second surface in a second direction of the third surface intersecting the first surface and the second surface, the support part facing, in the second direction, a first end of the first member close to the third surface in the first direction and a second end of the second member close to the third surface in the first direction. The support part includes a first facing surface that faces the first member in the second direction, a second facing surface that faces the second member in the second direction, and a third facing surface that faces the second member in the second direction and farther away from the second member than the second facing surface. The attachment part includes a one-side attachment part that is disposed at an end close to the first surface in the second direction, and at least one other-side attachment part that is disposed at an end close to the second surface in the second direction. The one-side attachment part includes a first projection that is provided at the first end of the first member, and extends from the first member toward the second member along the second direction, a first accommodation part that is disposed at the support part, is connected to a first opening provided in the first facing surface, and accommodates the first projection through the first opening, and a first movement restriction part that restricts movement of the first projection accommodated in the first accommodation part in the first direction. The at least one other-side attachment part includes a protrusion that is provided at the second end of the second member, and extends from the second member toward the third surface along the first direction, a second projection that extends from the protrusion in a direction away from the first member along the second direction, a second accommodation part that is disposed inside the housing, is connected to a second opening provided between the support part and the second surface in the second direction of the third surface, and accommodates the second projection through the second opening, and a second movement restriction part that restricts movement of the second projection accommodated in the second accommodation part in the first direction. The second opening is disposed between the third facing surface and the second surface in the second direction of the third surface.

According to the present disclosure, it is possible to realize the electronic device including the covering member that can be easily detached while the covering member is prevented from unintended falling off.

DETAILED DESCRIPTION (Background to Present Disclosure)

Figure 1:
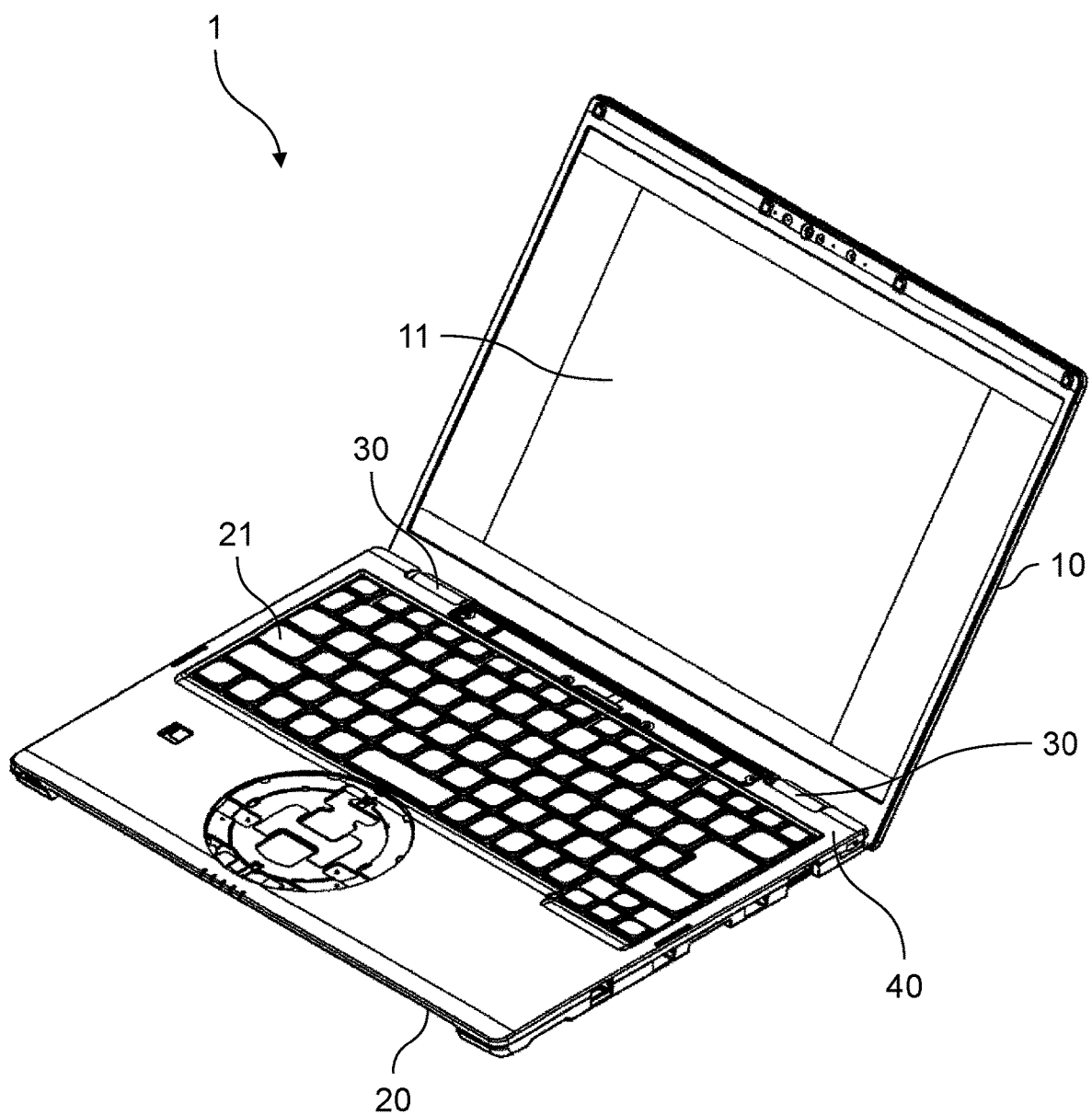
FIG. 1 is a schematic perspective view illustrating an electronic device of an exemplary embodiment of the present disclosure.

In the antenna device of PTL 1, an engagement part having a circumferential shape capable of fixing a position in an axial direction to a certain degree of force is formed on an inner peripheral surface of the cover and an outer peripheral surface of a core member. When force that can be fixed by the engagement part is increased, the cover is hardly detached. On the other hand, when the force that can be fixed by the engagement part is decreased, there is a concern that the cover unintentionally falls off. In this case, although it is conceivable to prevent the cover from unintentionally falling off by fixing the cover with a screw, it may take time and effort to detach the cover, and the screw may be exposed to an outside to deteriorate an outer appearance.

The inventors of the present invention have devised an electronic device including a covering member that can be easily detached while the covering member is prevented from unintended falling off, and have reached the following invention.

An electronic device according to a first aspect of the present disclosure includes a housing that includes a first surface, a second surface widening along the first surface, and a third surface intersecting the first surface and the second surface, a covering member that covers the third surface, and an attachment part that detachably attaches the covering member to the third surface of the housing. The covering member includes a first member that extends along the first surface, a second member that extends along the second surface and faces the first member, and a third member that faces the third surface, the third member being connected to an end of the first member far from the housing in a first direction intersecting with the third surface and an end of the second member far from the housing in the first direction. The housing includes a support part that is disposed between the first surface and the second surface in a second direction of the third surface intersecting the first surface and the second surface, the support part facing, in the second direction, a first end of the first member close to the third surface in the first direction and a second end of the second member close to the third surface in the first direction. The support part includes a first facing surface that faces the first member in the second direction, a second facing surface that faces the second member in the second direction, and a third facing surface that faces the second member in the second direction and farther away from the second member than the second facing surface. The attachment part includes a one-side attachment part that is disposed at an end close to the first surface in the second direction, and at least one other-side attachment part that is disposed at an end close to the second surface in the second direction. The one-side attachment part includes a first projection that is provided at the first end of the first member, and extends from the first member toward the second member along the second direction, a first accommodation part that is disposed at the support part, is connected to a first opening provided in the first facing surface, and accommodates the first projection through the first opening, and a first movement restriction part that restricts movement of the first projection accommodated in the first accommodation part in the first direction. The at least one other-side attachment part includes a protrusion that is provided at the second end of the second member, and extends from the second member toward the third surface along the first direction, a second projection that extends from the protrusion in a direction away from the first member along the second direction, a second accommodation part that is disposed inside the housing, is connected to a second opening provided between the support part and the second surface in the second direction of the third surface, and accommodates the second projection through the second opening, and a second movement restriction part that restricts movement of the second projection accommodated in the second accommodation part in the first direction. The second opening is disposed between the third facing surface and the second surface in the second direction of the third surface.

According to the electronic device of the first aspect, it is possible to realize the electronic device including the covering member that can be easily detached while the covering member is prevented from unintended falling off.

An electronic device according to a second aspect of the present disclosure further includes a first elastic member that is disposed between the second member and the support part and at an end in a third direction intersecting the first direction and the second direction, and a second elastic member that is disposed between the second member and the support part and at another end in the third direction. The at least one other-side attachment part includes a first other-side attachment part that is disposed in a middle in the third direction, a second other-side attachment part that is disposed at the end in the third direction, and a third other-side attachment part that is disposed at the other end in the third direction. The first elastic member biases the second projection of the second other-side attachment part in the second direction and in the direction away from the first member, and the second elastic member biases the second projection of the third other-side attachment part in the second direction and in the direction away from the first member.

According to the electronic device of the second aspect, it is possible to realize the electronic device including the covering member that can be easily detached while the covering member is more reliably prevented from unintended falling off.

In an electronic device according to a third aspect of the present disclosure, the third facing surface on which the second opening to which the second accommodation part of the first other-side attachment part is connected is disposed has a length in the third direction that is twice or more a length of the second projection of the first other-side attachment part.

According to the electronic device of the third aspect, it is possible to realize the electronic device including the covering member that can be easily detached while the covering member is more reliably prevented from unintended falling off.

In an electronic device according to a fourth aspect of the present disclosure, each of the first elastic member and the second elastic member is disposed between the second member and the support part in a state of being compressed by less than 50%.

According to the electronic device of the fourth aspect, it is possible to easily detach the covering member from the housing while the covering member is more reliably prevented from unintended falling off.

In an electronic device according to a fifth aspect of the present disclosure, the at least one other-side attachment part is disposed away in a third direction intersecting the first direction and the second direction from a virtual straight line passing through the one-side attachment part and extending in the second direction as viewed along the first direction.

According to the electronic device of the fifth aspect, it is possible to realize the electronic device including the covering member that can be easily detached while the covering member is more reliably prevented from unintended falling off.

Hereinafter, exemplary embodiments of the present disclosure will be described with reference to the drawings. Note that, in the drawings, the same components are denoted by the same reference marks, and description thereof will be omitted as appropriate. In addition, the exemplary embodiments are not intended to limit the present disclosure, but are examples, and can be appropriately changed without departing from the gist of the present disclosure.

As illustrated in FIG. 1, as an example, electronic device 1 of the present exemplary embodiment is, for example, a notebook personal computer (in other words, laptop PC). Electronic device 1 includes first unit 10 and second unit 20. First unit 10 is rotatably attached to second unit 20 through a pair of hinges 30.

First unit 10 includes display 11. Display 11 includes, for example, a liquid crystal display panel having a substantially rectangular shape. First unit 10 incorporates a central processing unit (CPU), a volatile storage (RAM), a nonvolatile storage (ROM, SSD, or the like), a battery, and the like. The nonvolatile storage stores an operating system (OS), various application programs, various data, and the like. The central processing unit executes arithmetic processing by reading the OS, the application programs, and the various data, thereby realizing various functions.

Second unit 20 includes input unit 21 including a keyboard and a touch pad, and is configured such that a user can perform input processing through input unit 21. In FIG. 1, a part of a configuration of second unit 20 is omitted.

The pair of hinges 30 can hold first unit 10 at any angle with respect to second unit 20 by rotating first unit 10 with respect to second unit 20 about a rotation shaft extending along a width direction (for example, X direction) of electronic device 1. For example, as illustrated in FIG. 1, electronic device 1 can hold first unit 10 in an opened state forming any angle (for example, approximately 120 degrees illustrated in FIG. 1) with respect to second unit 20 by the pair of hinges 30. In addition, in electronic device 1, first unit 10 can be held in a closed state forming an angle of substantially 0 degrees with respect to second unit 20 by the pair of hinges 30. The closed state is a state where first unit 10 and second unit 20 face each other closely and are substantially parallel to each other.

Figure 2:
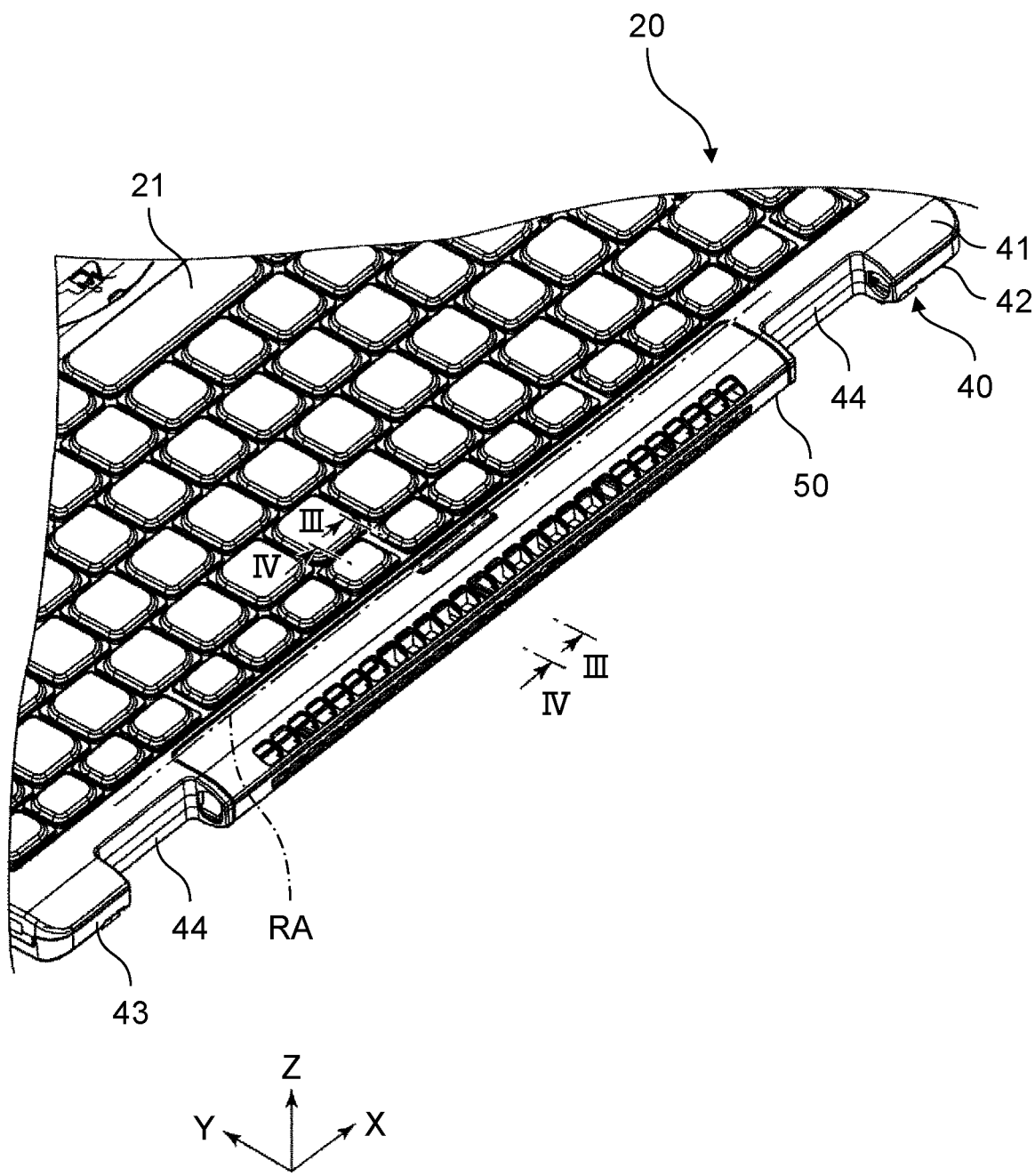
FIG. 2 is a partial perspective view of a second unit of the electronic device of FIG. 1.

Next, the configuration of second unit 20 will be described. In FIG. 2, first unit 10 is omitted.

As illustrated in FIG. 2, second unit 20 includes housing 40, covering member 50 attached to housing 40, and attachment part 60 (see FIGS. 3 and 4) for detachably attaching covering member 50 to housing 40. In the present exemplary embodiment, covering member 50 protects antenna 71 (see FIG. 5).

Figure 3:
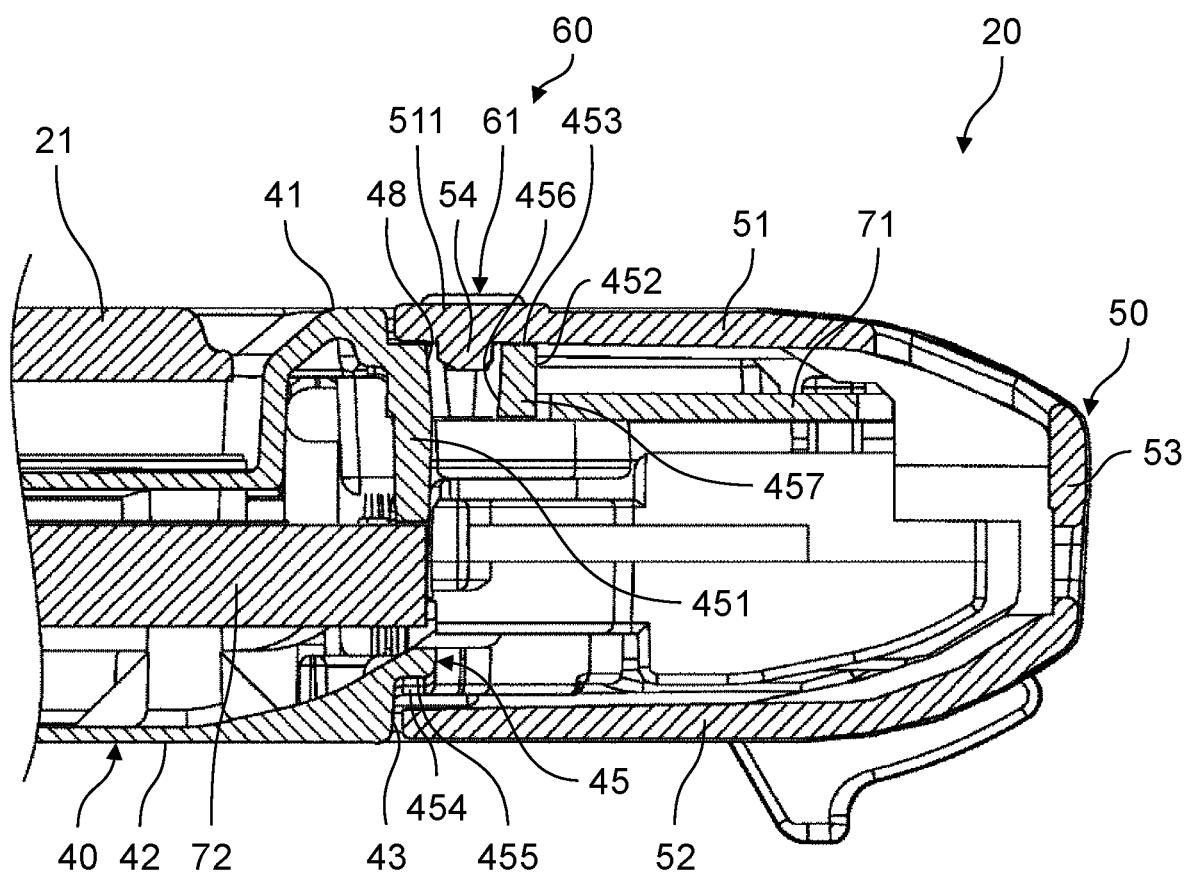
FIG. 3 is a cross-sectional view taken along line of FIG. 2.

As an example, as illustrated in FIG. 1, housing 40 is a plate-shaped member constituting a framework of second unit 20 having a substantially rectangular shape, and includes first surface 41 and second surface 42 that intersect in a thickness direction (for example, Z direction), and third surface 43 that intersects first surface 41 and second surface 42 as illustrated in FIG. 3. In the present exemplary embodiment, input unit 21 is disposed on first surface 41. Second surface 42 constitutes a surface opposite to first surface 41 in the thickness direction of housing 40, and extends along first surface 41. Third surface 43 constitutes one side surface in a lateral direction (for example, Y direction) of housing 40.

In the present exemplary embodiment, housing 40 includes hinge attachment parts 44 to which hinges 30 are attached. Hinge attachment part 44 is disposed near both ends of third surface 43 in a longitudinal direction (for example, X direction) of housing 40. Covering member 50 is attached between hinge attachment parts 44 of third surface 43.

Hereinafter, the lateral direction of housing 40 (in other words, a direction intersecting third surface 43) is referred to as first direction Y, the thickness direction of housing 40 (in other words, a direction intersecting first surface 41 and second surface 42) is referred to as second direction Z, and the longitudinal direction of housing 40 (in other words, a direction intersecting first direction Y and second direction Z) is referred to as third direction X.

Figure 4:
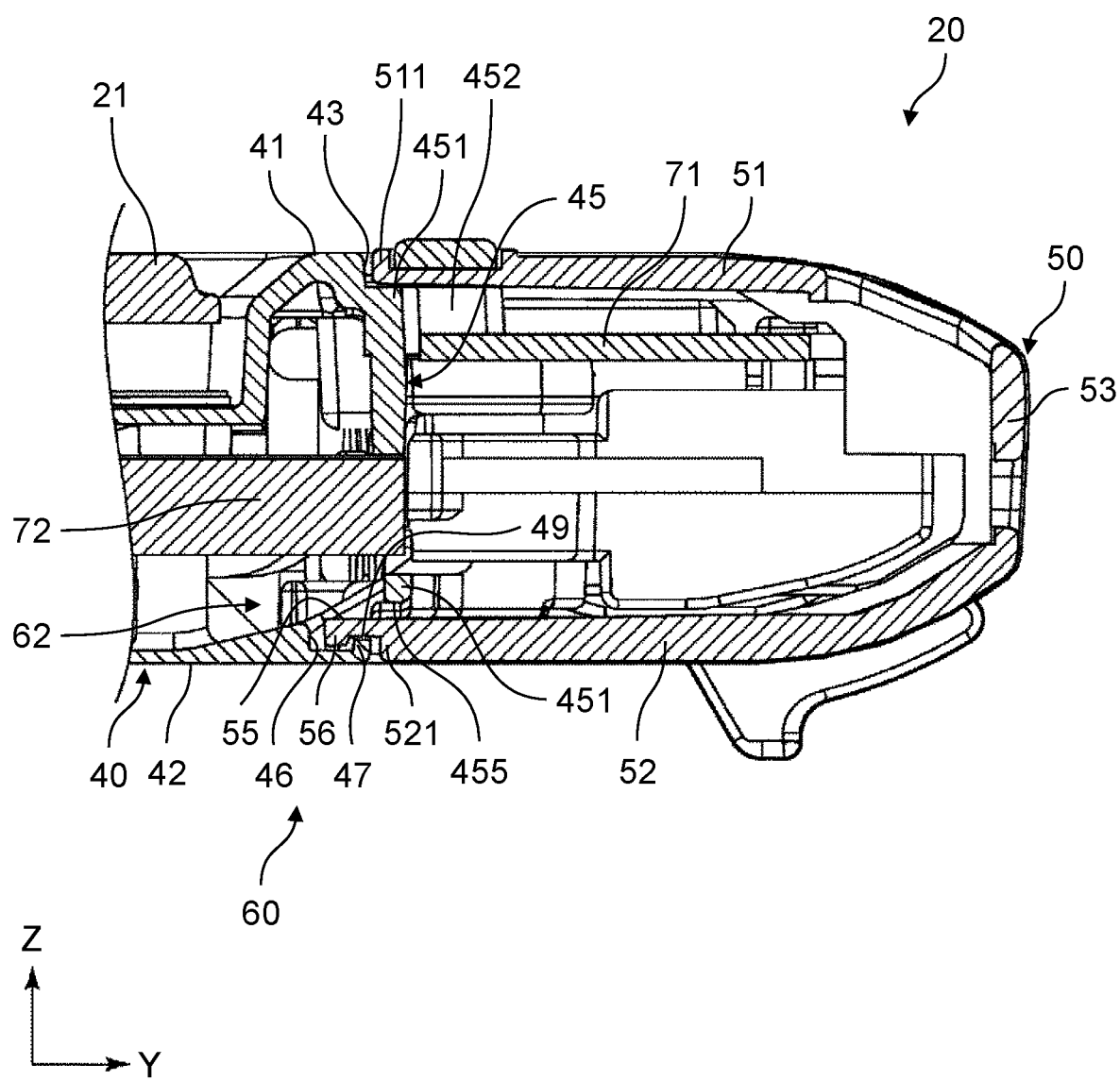
FIG. 4 is a cross-sectional view taken along line Iv-Iv of FIG. 2.
Figure 5:
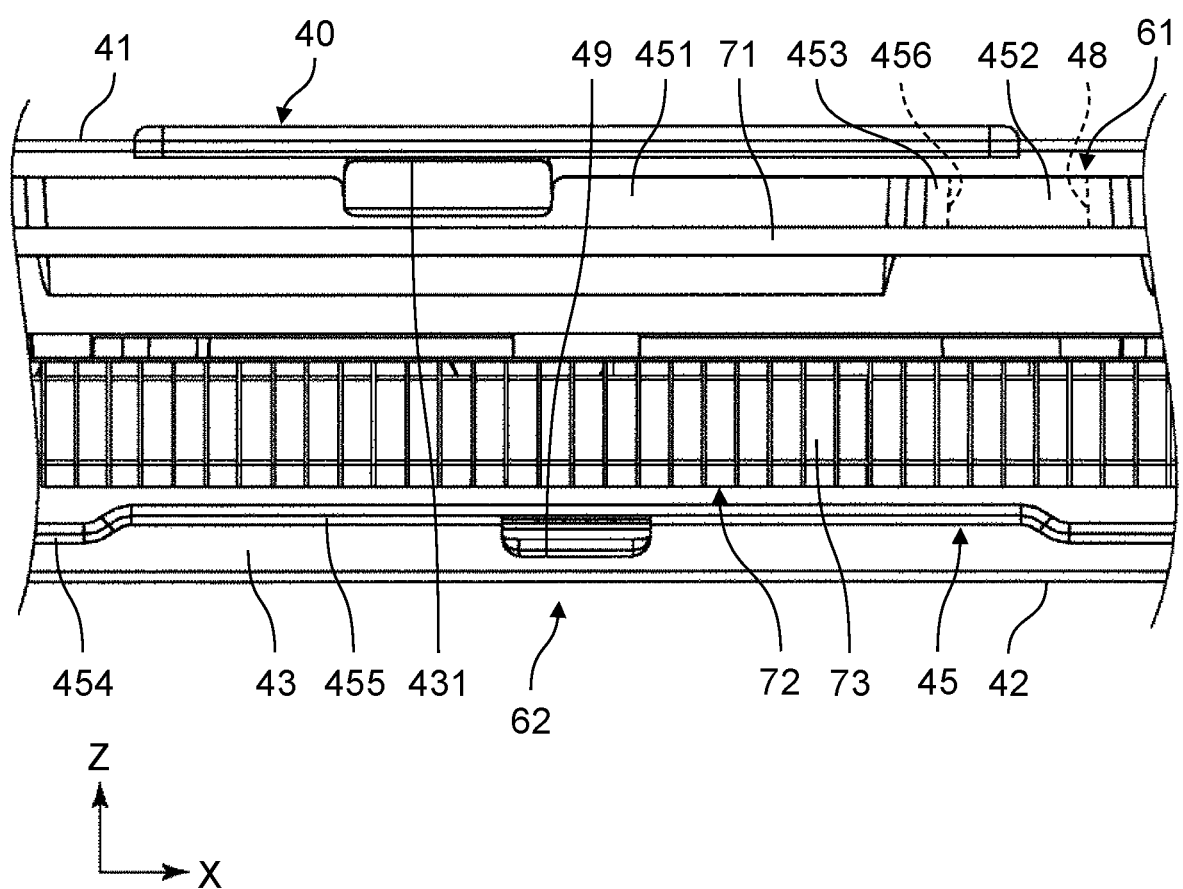
FIG. 5 is a partial side view of the second unit of FIG. 2.

As illustrated in FIGS. 3 and 4, housing 40 includes support part 45 disposed between first surface 41 and second surface 42 in second direction Z of third surface 43. Support part 45 faces first end 511 of first member 51 and second end 521 of second member 52 of covering member 50 to be described later in second direction Z. As illustrated in FIGS. 3 to 5, support part 45 includes first facing surface 453, second facing surface 454, and third facing surface 455. First facing surface 453 faces first member 51 in second direction Z. Second facing surface 454 faces second member 52 in second direction Z. Third facing surface 455 faces second member 52 in second direction Z and is disposed farther away from second member 52 than second facing surface 454.

As illustrated in FIG. 3, support part 45 includes first accommodation part 456 that accommodates first projection 54 of covering member 50 to be described later, and first movement restriction part 457 that restricts movement of first projection 54 accommodated in first accommodation part 456 in first direction Y. First accommodation part 456 is connected to first opening 48 provided in first facing surface 453 and accommodates first projection 54 through first opening 48.

In the present exemplary embodiment, support part 45 includes support 451 and four protrusions 452 disposed at intervals in third direction X. Support 451 has a substantially rectangular parallelepiped shape extending along third direction X, and protrudes from third surface 43 in a direction approaching third member 53 of covering member 50 to be described later along first direction Y. Each protrusion 452 is provided at an end of support 451 close to first surface 41 in second direction Z, and protrudes from support 451 in a direction approaching third member 53 along first direction Y. A through-hole penetrating each protrusion 452 in second direction Z and connected to first opening 48 forms first accommodation part 456, and first projection 54 is accommodated inside the through-hole. A portion of each protrusion 452 farther away from support 451 than first accommodation part 456 in first direction Y forms first movement restriction part 457.

Figure 7:
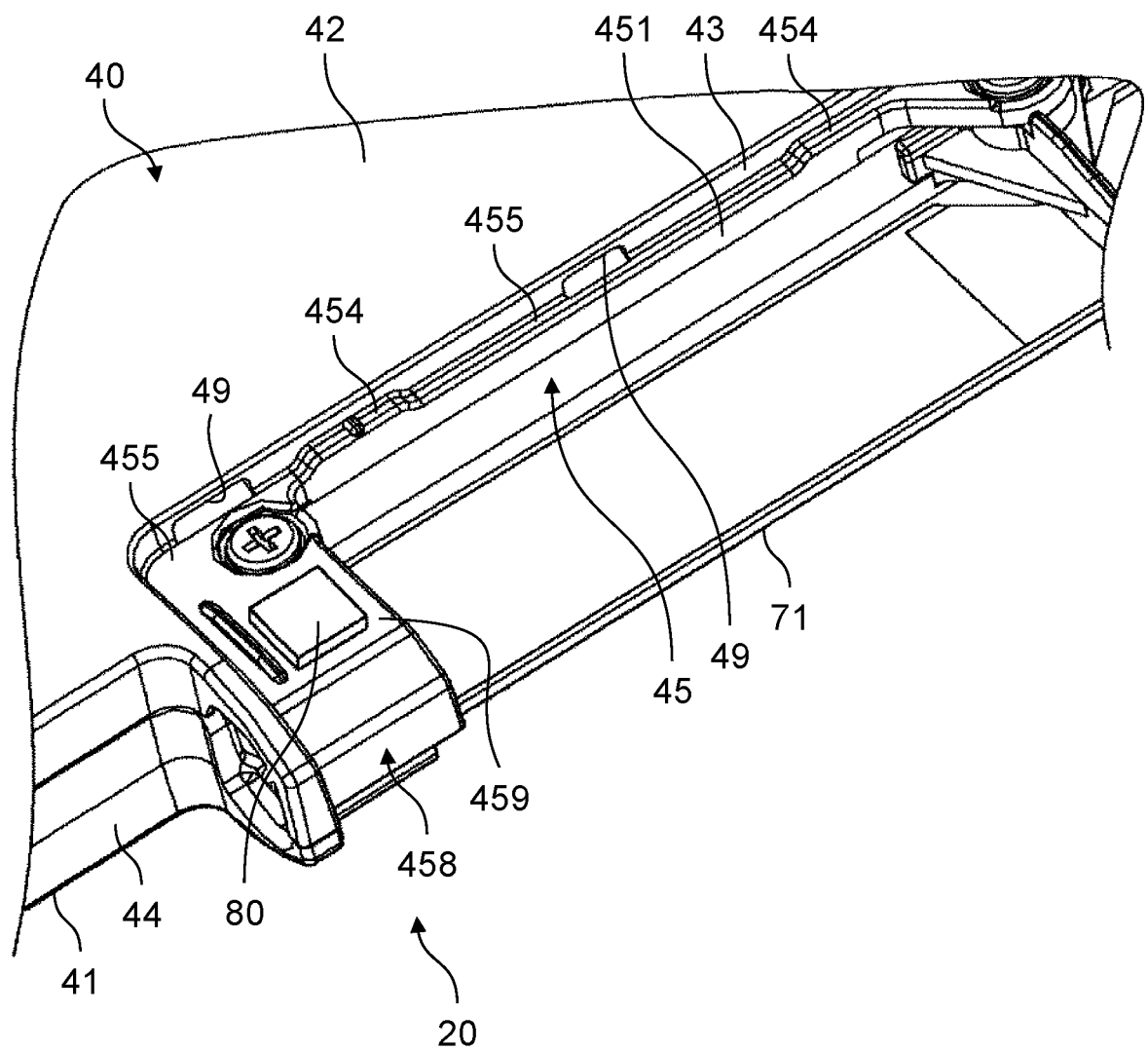
FIG. 7 is a partial perspective view of the second unit of FIG. 2 as viewed from a second surface side.

As illustrated in FIG. 7, support 451 includes extension parts 458 provided at both ends in third direction X and extending to near third member 53 along first direction Y. Each extension part 458 includes facing surface 459 facing second member 52 of covering member 50 and substantially the same as third facing surface 455. Elastic member 80 is disposed on facing surface 459 of each extension part 458. In other words, elastic members 80 are disposed between second member 52 and support part 45 and on both sides in third direction X. In FIG. 7, covering member 50 is omitted.

As an example, each elastic member 80 is disposed between second member 52 and support part 45 in a state of being compressed by less than 50%, more preferably in a state of being compressed by 40% to 45%. Each elastic member 80 is disposed between third surface 43 of housing 40 and third member 53 of covering member 50 in first direction Y, and biases second projection 56 (see FIG. 4) of covering member 50 to be described later in second direction Z and in a direction away from first member 51.

As illustrated in FIG. 4, housing 40 includes second accommodation part 46 that accommodates second projection 56 of covering member 50, and second movement restriction part 47 that restricts the movement of second projection 56 accommodated in second accommodation part 46 in first direction Y. Second accommodation part 46 is disposed at an end close to third surface 43 in first direction Y and an end close to second surface 42 in second direction Z inside housing 40. In the present exemplary embodiment, second accommodation part 46 is constituted by a recess recessed from an inner surface opposite to second surface 42 in second direction Z of housing 40 toward second surface 42 with respect to second opening 49 in second direction Z, and second projection 56 is accommodated inside the recess. A portion of housing 40 closer to third surface 43 than second accommodation part 46 in first direction Y constitutes second movement restriction part 47.

As illustrated in FIG. 5, second opening 49 and third opening 431 are provided on third surface 43 of housing 40. Second opening 49 is disposed between third facing surface 455 and second surface 42 in second direction Z of third surface 43. Second opening 49 is connected to second accommodation part 46, and is configured to allow insertion of protrusion 55 and second projection 56 of covering member 50 to be described later. Third opening 431 is disposed between first surface 41 and support part 45 in second direction Z of third surface 43, and is configured to be capable of inserting protrusion 57 (see FIG. 6) of covering member 50 to be described later. An accommodation space (not illustrated) capable of accommodating protrusion 57 is provided inside housing 40, and third opening 431 is connected to the accommodation space.

In the present exemplary embodiment, three third openings 431 are provided on third surface 43 of housing 40 at intervals in third direction X, and five second openings 49 are provided at intervals in third direction X. Each third opening 431 has a substantially rectangular shape in which third direction X is the longitudinal direction, and each second opening 49 has a substantially rectangular shape in which third direction X is the longitudinal direction. Antenna 71 is fixed to an end of support part 45 close to third opening 431 in second direction Z. Exhaust port 73 of exhaust duct 72 is opened at an end of support part 45 close to second opening 49 in second direction Z.

As illustrated in FIGS. 3 and 4, covering member 50 has a substantially C-shape as viewed along third direction X, and includes first member 51, second member 52, and third member 53. First member 51 extends along first surface 41. Second member 52 extends along second surface 42 and faces first member 51 in second direction Z. Third member 53 faces third surface 43 and is connected to an end of first member 51 far from housing 40 in first direction Y and an end of second member 52 far from housing 40 in first direction Y.

As illustrated in FIG. 3, covering member 50 includes first projection 54 provided at first end 511 of first member 51 close to third surface 43 in first direction Y. First projection 54 extends from first end 511 of first member 51 toward second member 52 along second direction Z and is accommodated in first accommodation part 456 of support part 45.

As illustrated in FIG. 4, covering member 50 includes protrusion 55 provided at second end 521 of second member 52 close to third surface 43 in first direction Y, and second projection 56 provided at protrusion 55. Protrusion 55 extends from second end 521 of second member 52 toward third surface 43 along first direction Y. Second projection 56 extends from protrusion 55 in the direction away from first member 51 along second direction Z and is accommodated in second accommodation part 46.

Figure 6:
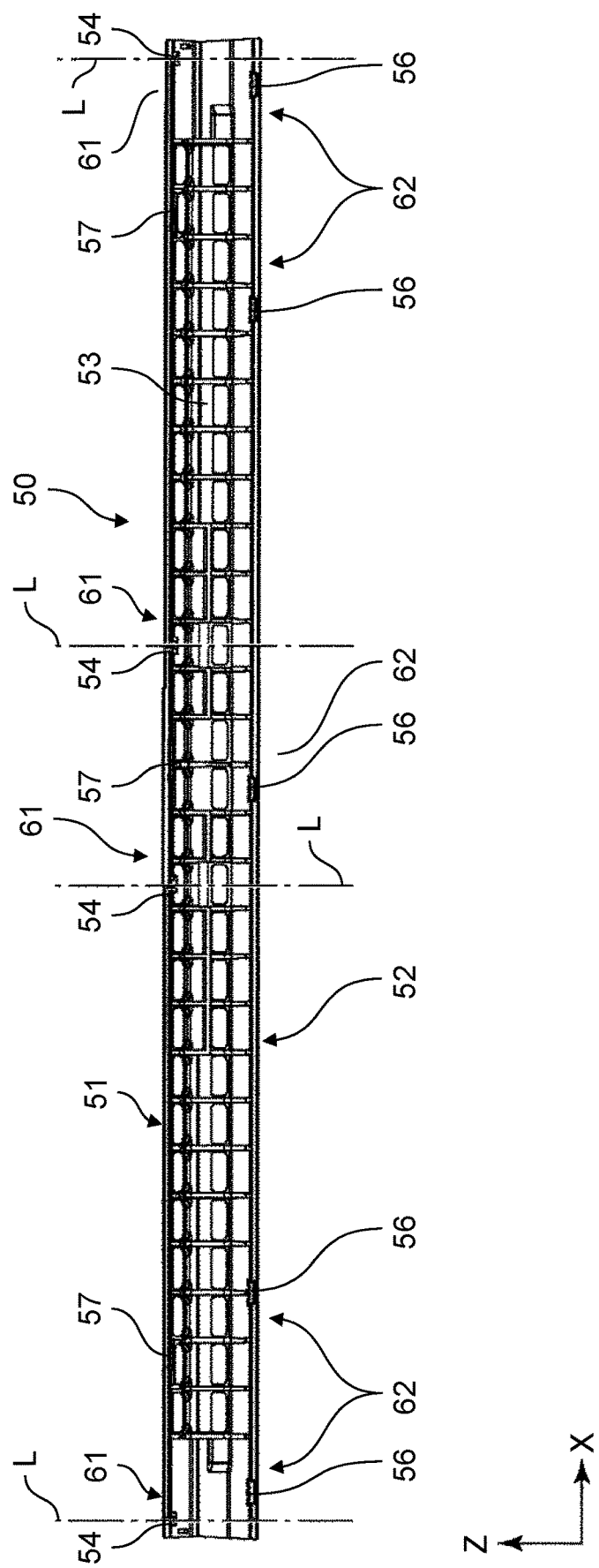
FIG. 6 is a side view illustrating a covering member of the second unit in FIG. 2.

In the present exemplary embodiment, as illustrated in FIG. 6, covering member includes four first projections 54, five second projections 56, and three protrusions 57. First projections 54 are disposed at intervals in third direction X. Second projections 56 are disposed at intervals in third direction X. Protrusions 57 are disposed between first projections 54 in third direction X. Protrusions 57 extend from first end 511 of first member 51 toward third surface 43 along first direction Y, and are accommodated in the accommodation space inside housing 40 through third opening 431.

As illustrated in FIGS. 2 and 3, attachment part 60 includes one-side attachment parts 61 disposed at an end close to first surface 41 in second direction Z, and other-side attachment parts 62 disposed at an end close to second surface 42 side in second direction Z. One-side attachment part 61 includes first accommodation part 456 of housing 40 and first projections 54 of covering member 50. Other-side attachment part 62 includes second accommodation part 46 of housing 40 and protrusion 55 and second projection 56 of covering member 50.

In the present exemplary embodiment, attachment part 60 includes four one-side attachment parts 61 and five other-side attachment parts 62. As illustrated in FIG. 6, two one-side attachment parts 61 are disposed in the middle of first member 51 in third direction X, and one-side attachment parts 61 are disposed at both ends of first member 51 in third direction X, respectively. One other-side attachment part 62 (an example of first other-side attachment part) is disposed substantially at a center of second member 52 in third direction X, and other-side attachment parts 62 (an example of second other-side attachment part and third other-side attachment part) are disposed at both ends of second member 52 in third direction X, respectively. Other-side attachment parts 62 are disposed between other-side attachment parts 62 at the substantially center and other-side attachment parts 62 at both ends in third direction X one by one. As viewed along first direction Y, each other-side attachment part 62 is disposed away in third direction X from a virtual straight line (in FIG. 6, virtual straight line L that passes through first projection 54 and extends in second direction Z) passing through each one-side attachment part 61 and extending in second direction Z. FIG. 6 does not illustrate first accommodation part 456 of one-side attachment part 61 and second accommodation part 46 of other-side attachment part 62.

As illustrated in FIG. 5, third facing surface 455 disposed substantially at the center in third direction X has a length in third direction X that is twice or more a length of second projection 56 accommodated in second accommodation part 46 through second opening 49 disposed in third facing surface 455. Accordingly, in a state where covering member 50 is attached to housing 40, second member 52 is elastically deformed in a direction approaching first member 51, and second projection 56 can be detached from second accommodation part 46. As illustrated in FIG. 6, similarly, third facing surface 455 at the substantially center in third direction X and third facing surface 455 disposed between third facing surfaces 455 at both ends also have a length in third direction X that is twice or more the length of second projection 56 accommodated in second accommodation part 46 through second opening 49 disposed in third facing surface 455.

In a case where covering member 50 attached to housing 40 is detached, first, second end 521 of second member 52 is pressed in the direction approaching first member 51 along second direction Z to be elastically deformed. Accordingly, second projection 56 moves in second accommodation part 46 in the direction approaching first member 51 along second direction Z, and the position restriction of second projection 56 by second movement restriction part 47 is released. Thereafter, in a state where second end 521 of second member 52 is elastically deformed, covering member 50 is rotated about rotation shaft RA with a contact portion between an edge of third opening 431 of housing 40 and protrusion 57 of first member 51 as rotation shaft RA (illustrated in FIG. 2). Accordingly, second projection 56 is taken out from second accommodation part 46, and covering member 50 is detached from housing 40.

In a case where covering member 50 is attached to housing 40, contrary to a case where covering member 50 attached to housing 40 is detached, first, protrusion 57 is accommodated in third opening 431 while first projections 54 of first member 51 is accommodated in first accommodation part 456. Covering member 50 is rotated about rotation shaft RA to cause second end 521 of second member 52 to approach third surface 43. Thereafter, in a state where second end 521 of second member 52 is pressed in the direction approaching first member 51 along second direction Z to be elastically deformed, covering member 50 is further rotated to insert second projection 56 into second opening 49. Accordingly, second projection 56 is accommodated in second accommodation part 46, and covering member 50 is attached to housing 40.

Electronic device 1 can exhibit the following effects.

According to electronic device 1, attachment part 60 includes one-side attachment part 61 disposed at the end close to first surface 41 in the second direction and at least one other-side attachment part 62 disposed at the end close to second surface 42 in the second direction. One-side attachment part 61 includes first projection 54, first accommodation part 456, and first movement restriction part 457. First projection 54 is provided at first end 511 of first member 51 and extends from first member 51 toward second member 52 along the second direction. First accommodation part 456 is connected to first opening 48 provided in first facing surface 453 and accommodates first projection 54 through first opening 48. First movement restriction part 457 restricts the movement of first projection 54 accommodated in first accommodation part 456 in the first direction. Other-side attachment part 62 includes protrusion 55, second projection 56, second accommodation part 46, and second movement restriction part 47. Protrusion 55 is provided at second end 521 of second member 52 and extends from second member 52 toward third surface 43 along the first direction. Second projection 56 extends from protrusion 55 along the second direction in the direction away from first member 51. Second accommodation part 46 is disposed inside housing 40, is connected to second opening 49 provided between support part 45 and second surface 42 in the second direction of third surface 43, and accommodates second projection 56 through second opening 49. Second movement restriction part 47 restricts the movement of second projection 56 accommodated in second accommodation part 46 in the first direction. Second opening 49 is disposed between third facing surface 455 and second surface 42 in the second direction of third surface 43. With such a configuration, covering member 50 can be detached from housing 40 only by pressing second end 521 of second member 52 toward first member 51 and rotating covering member 50. As a result, it is possible to realize the electronic device including the covering member that is easily removable while the covering member is prevented from unintended falling off. In addition, since it is not necessary to use a fastening member such as a screw for attaching covering member 50 to housing 40, an outer appearance of electronic device 1 is not impaired by the screw or the like.

Usually, both ends of support part 45 in the third direction cannot sufficiently secure the length of third facing surface 455 in the third direction. Electronic device 1 includes elastic members 80 disposed between second member 52 and support part 45 and at both ends in the third direction. With such a configuration, even at both ends in the third direction where the length of third facing surface 455 in the third direction cannot be sufficiently secured, second member 52 of covering member 50 in a state of being attached to housing 40 can be elastically deformed in the direction approaching first member 51, and second projection 56 can be detached from second accommodation part 46. In addition, according to electronic device 1, each elastic member 80 biases second projection 56 of second member 52 disposed at each of both ends in the third direction in the second direction and in the direction away from first member 51. With such a configuration, it is possible to more reliably prevent covering member 50 from unintentionally falling off. As described above, according to electronic device 1, it is possible to realize the electronic device including the covering member that can be easily detached while the covering member is more reliably prevented from unintended falling off.

Third facing surface 455 in which second opening 49 to which second accommodation part 46 of other-side attachment part 62 disposed in the middle in the third direction is connected is disposed has the length in the third direction that is twice or more the length of second projection 56 of other-side attachment part 62. With such a configuration, second projection 56 can be more easily detached from second accommodation part 46. As a result, it is possible to realize the electronic device including the covering member that can be easily detached while the covering member is more reliably prevented from unintended falling off.

Each elastic member 80 is disposed between second member 52 and support part in a state of being compressed by less than 50%. With such a configuration, it is possible to easily detach covering member 50 from housing 40 while covering member 50 is more reliably prevented from unintended falling off.

Other-side attachment part 62 is disposed away from virtual straight line L, which passes through one-side attachment part 61 and extends in the second direction, in the third direction as viewed along the first direction. With such a configuration, it is possible to realize the electronic device including the covering member that can be easily detached while the covering member is more reliably prevented from unintended falling off.

Electronic device 1 can also be configured as follows.

Housing 40 can adopt any shape including first surface 41, second surface 42, and third surface 43.

Covering member 50 is not limited to third surface 43 of housing 40, and can be configured to cover any portion of housing 40. In addition, covering member 50 may be attached to first unit 10 instead of second unit 20. In this case, attachment part 60 is also provided in first unit 10.

Covering member 50 can adopt any shape including first member 51, second member 52, and third member 53. For example, members connected to first member 51, second member 52, and third member 53 may be provided at one end or both ends in third direction X.

Attachment part 60 may have at least one one-side attachment part 61 and at least one other-side attachment part 62.

Elastic member 80 can be omitted. In addition, elastic member 80 is not limited to a case of being disposed in a state of being compressed by less than 50%. A compression aspect of elastic member 80 can be voluntarily set in accordance with the design or the like of electronic device 1.

Other-side attachment part 62 is not limited to a case of being disposed away from virtual straight line L in third direction X as viewed along first direction Y, and may be disposed on virtual straight line L.

Any proper combination of the embodiments or modifications among the various exemplary embodiments and modifications may have the effects of the embodiments or modifications. In addition, a combination of exemplary embodiments, a combination of examples, or a combination of an exemplary embodiment and an example, and a combination of features of different exemplary embodiments or examples can be made.

Although the present disclosure has been described in connection with a preferable exemplary embodiment with reference to the accompanying drawings, various modifications and corrections are obvious to those skilled in the art. It is to be understood that such modifications and changes are included within the scope of the present disclosure according to the appended claims unless such modifications and changes depart from the scope of the present disclosure.

The present disclosure is widely applicable to electronic devices including notebook personal computers.

What is claimed is:

1. An electronic device comprising:
a housing that includes a first surface, a second surface widening along the first surface, and a third surface intersecting the first surface and the second surface;
a covering member that covers the third surface; and
an attachment part that detachably attaches the covering member to the third surface of the housing, wherein
the covering member includes
a first member that extends along the first surface,
a second member that extends along the second surface and faces the first member, and
a third member that faces the third surface, the third member being connected to an end of the first member far from the housing in a first direction intersecting with the third surface and an end of the second member far from the housing in the first direction,
the housing includes a support part that is disposed between the first surface and the second surface in a second direction of the third surface intersecting the first surface and the second surface, the support part facing, in the second direction, a first end of the first member close to the third surface in the first direction and a second end of the second member close to the third surface in the first direction,
the support part includes
a first facing surface that faces the first member in the second direction,
a second facing surface that faces the second member in the second direction, and
a third facing surface that faces the second member in the second direction and farther away from the second member than the second facing surface,
the attachment part includes
a one-side attachment part that is disposed at an end close to the first surface in the second direction, and
at least one other-side attachment part that is disposed at an end close to the second surface in the second direction,
the one-side attachment part includes
a first projection that is provided at the first end of the first member, and extends from the first member toward the second member along the second direction,
a first accommodation part that is disposed at the support part, is connected to a first opening provided in the first facing surface, and accommodates the first projection through the first opening, and
a first movement restriction part that restricts movement of the first projection accommodated in the first accommodation part in the first direction, the at least one other-side attachment part includes
a protrusion that is provided at the second end of the second member, and extends from the second member toward the third surface along the first direction,
a second projection that extends from the protrusion in a direction away from the first member along the second direction,
a second accommodation part that is disposed inside the housing, is connected to a second opening provided between the support part and the second surface in the second direction of the third surface, and accommodates the second projection through the second opening, and
a second movement restriction part that restricts movement of the second projection accommodated in the second accommodation part in the first direction, and
the second opening is disposed between the third facing surface and the second surface in the second direction of the third surface.

2. The electronic device according to claim 1, further comprising:
a first elastic member that is disposed between the second member and the support part and at an end in a third direction intersecting the first direction and the second direction; and
a second elastic member that is disposed between the second member and the support part and at another end in the third direction, wherein
the at least one other-side attachment part includes
a first other-side attachment part that is disposed in a middle in the third direction,
a second other-side attachment part that is disposed at the end in the third direction, and
a third other-side attachment part that is disposed at the other end in the third direction,
the first elastic member biases the second projection of the second other-side attachment part in the second direction and in the direction away from the first member, and
the second elastic member biases the second projection of the third other-side attachment part in the second direction and in the direction away from the first member.

3. The electronic device according to claim 2, wherein the third facing surface on which the second opening to which the second accommodation part of the first other-side attachment part is connected is disposed has a length in the third direction that is twice or more a length of the second projection of the first other-side attachment part.

4. The electronic device according to claim 2, wherein each of the first elastic member and the second elastic member is disposed between the second member and the support part in a state of being compressed by less than 50%.

5. The electronic device according to claim 1, wherein the at least one other-side attachment part is disposed away in a third direction intersecting the first direction and the second direction from a virtual straight line passing through the one-side attachment part and extending in the second direction as viewed along the first direction.

* * * * *